United States Patent
Matsumoto et al.

(10) Patent No.: US 11,156,565 B2
(45) Date of Patent: Oct. 26, 2021

(54) METHOD FOR INSPECTING SEMICONDUCTOR DEVICE

(71) Applicant: HAMAMATSU PHOTONICS K.K., Hamamatsu (JP)

(72) Inventors: Toru Matsumoto, Hamamatsu (JP); Kazushige Koshikawa, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 3 days.

(21) Appl. No.: 16/618,862

(22) PCT Filed: May 14, 2018

(86) PCT No.: PCT/JP2018/018589
§ 371 (c)(1),
(2) Date: Dec. 3, 2019

(87) PCT Pub. No.: WO2018/225459
PCT Pub. Date: Dec. 13, 2018

(65) Prior Publication Data
US 2020/0386693 A1 Dec. 10, 2020

(30) Foreign Application Priority Data
Jun. 6, 2017 (JP) .............................. JP2017-111918

(51) Int. Cl.
*G01N 21/956* (2006.01)
*G06T 7/00* (2017.01)

(52) U.S. Cl.
CPC ......... *G01N 21/956* (2013.01); *G06T 7/0004* (2013.01); *G06T 2207/30148* (2013.01)

(58) Field of Classification Search
CPC ................ G01N 21/956; G06T 7/0004; G06T 2207/30148
See application file for complete search history.

(56) References Cited

U.S. PATENT DOCUMENTS

| 2006/0170444 | A1 | 8/2006 | Wu et al. |
| 2009/0290615 | A1 | 11/2009 | Bernstein |
| 2015/0187058 | A1 | 7/2015 | Hotta |

FOREIGN PATENT DOCUMENTS

| CN | 101208609 A | 6/2008 |
| CN | 102859675 A | 1/2013 |

(Continued)

OTHER PUBLICATIONS

International Preliminary Report on Patentability dated Dec. 19, 2019 for PCT/JP2018/018589.

*Primary Examiner* — Jamil Ahmed
(74) *Attorney, Agent, or Firm* — Faegre Drinker Biddle & Reath LLP

(57) ABSTRACT

Provided is a method for inspecting a semiconductor device which performs an inspection of a semiconductor device as an object to be inspected, including attaching an adhesive tape to a surface to be inspected of the semiconductor device, acquiring a first pattern image based on a light detected from a region including a surface of the surface to be inspected to which the adhesive tape is attached, inputting an electrical signal to the semiconductor device to which the adhesive tape is attached, acquiring a first heat generation image by detecting light according to heat radiation from the region including the surface to which the adhesive tape is attached in a state in which the electrical signal is input, and superimposing the first pattern image and the first heat generation image.

8 Claims, 7 Drawing Sheets

(56) References Cited

FOREIGN PATENT DOCUMENTS

| | | | |
|---|---|---|---|
| CN | 103380366 A | 10/2013 | |
| JP | H07-181155 A | 7/1995 | |
| JP | H07181155 A * | 7/1995 | ............ G01N 25/72 |
| JP | H07-311168 A | 11/1995 | |
| JP | H07311168 A * | 11/1995 | ............ G01N 25/72 |
| JP | 2007-003306 A | 1/2007 | |
| JP | 2013-526723 A | 6/2013 | |
| JP | 2015-34817 A | 2/2015 | |
| JP | 2016-148550 A | 8/2016 | |
| TW | 200817701 | 4/2008 | |
| WO | WO-2011/156527 A1 | 12/2011 | |

* cited by examiner

Fig.3
(a)
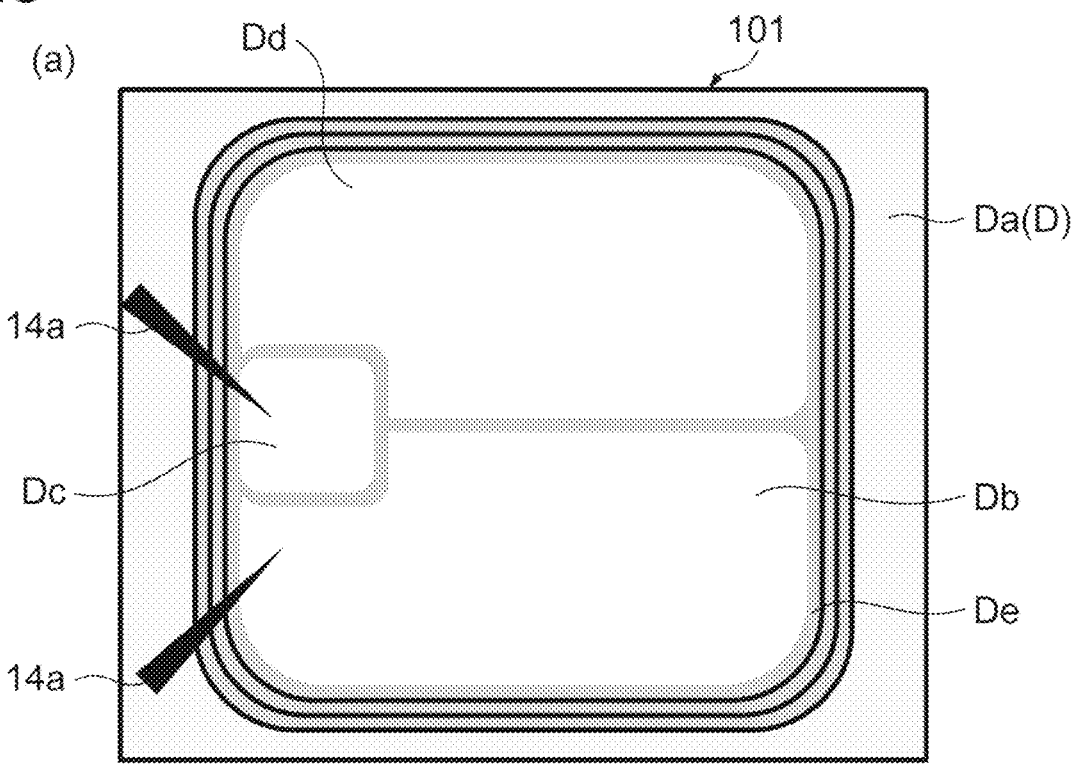
(b)
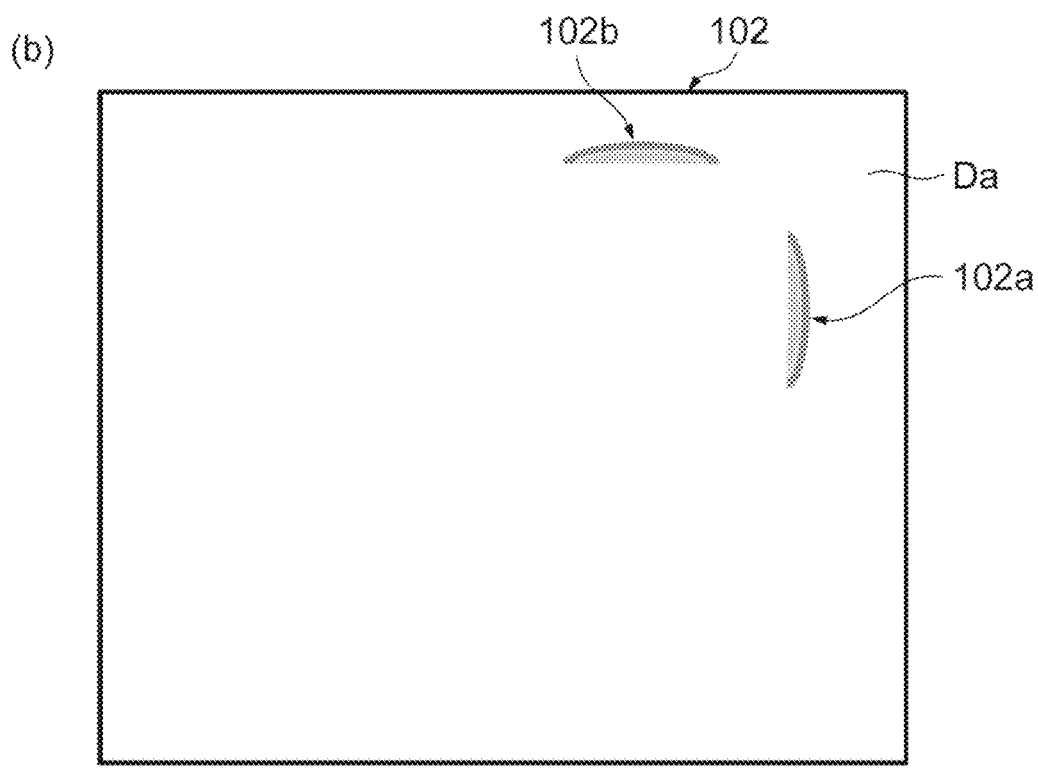

Fig.5
(a)
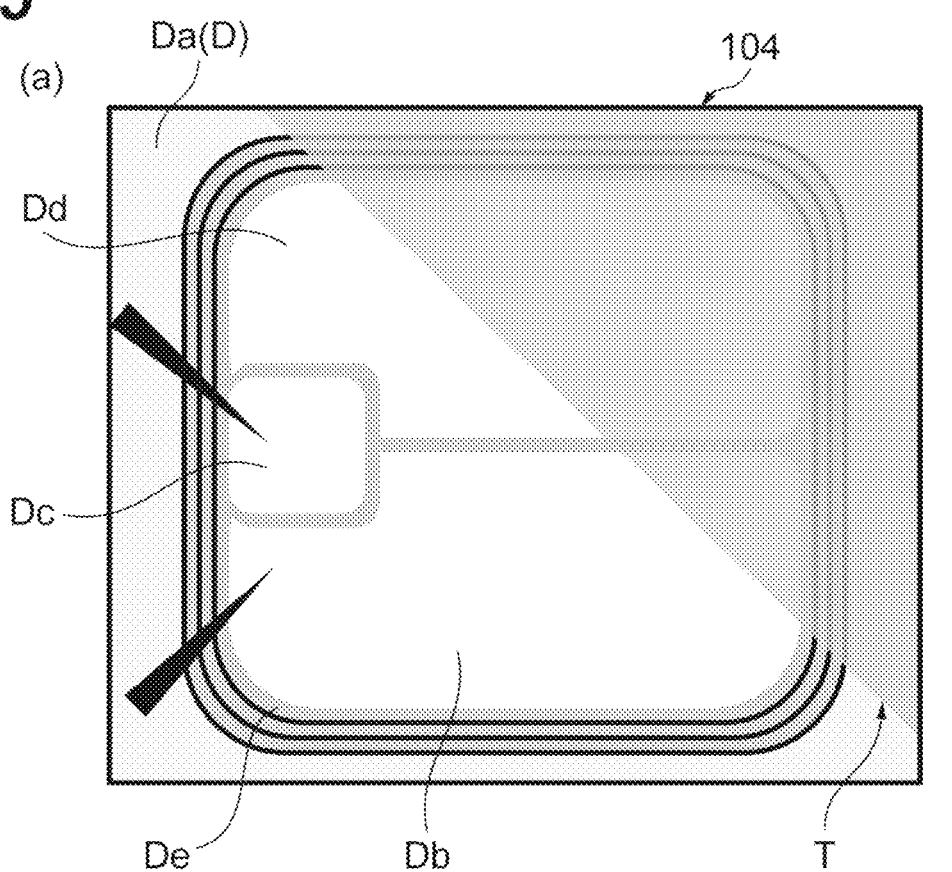
(b)
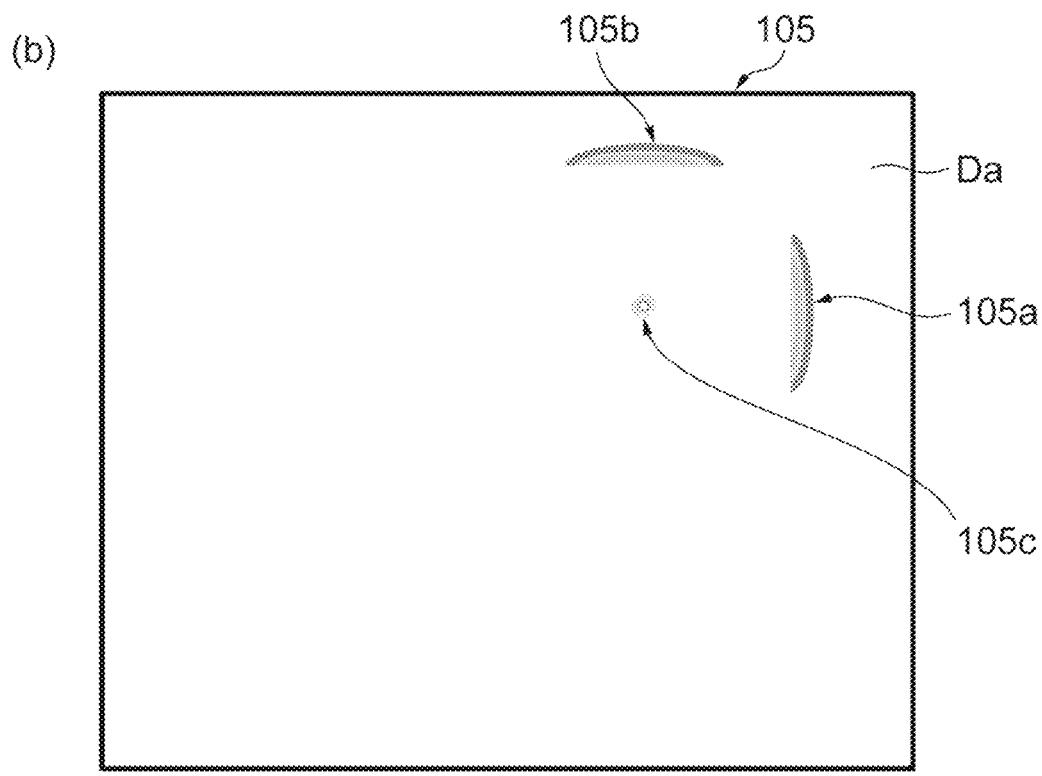

METHOD FOR INSPECTING SEMICONDUCTOR DEVICE

TECHNICAL FIELD

The present disclosure relates to a method for inspecting a semiconductor device.

BACKGROUND ART

Patent Literature 1 discloses a method for identifying a position of a heat source generated in a semiconductor device. In this method, the semiconductor device is photographed using an infrared sensor while an electrical signal is applied to the semiconductor device, and a temperature distribution of the semiconductor device is detected from the photographed image.

CITATION LIST

Patent Literature

[Patent Literature 1] Japanese Unexamined Patent Publication No. 2013-526723

SUMMARY OF INVENTION

Technical Problem

In such a conventional method as described above, even though there is a portion which generates heat inside the semiconductor device, the detection accuracy of heat rays (heat radiation) may be lowered according to a material constituting a surface of the semiconductor device. In particular, when the surface of the semiconductor device is covered with a metal, an amount of radiated heat rays tends to decrease.

An object of the present disclosure is to provide a method for inspecting a semiconductor device which is able to enhance detection accuracy of heat rays.

Solution to Problem

A method for inspecting a semiconductor device according to one aspect of the present disclosure is a method for inspecting a semiconductor device which performs an inspection of a semiconductor device as an object to be inspected, including a first step of attaching an adhesive tape having an emissivity of 0.9 or more and a light transmittance of 60% or more at a wavelength of 300 nm to 2000 nm to a surface to be inspected of the semiconductor device, a second step of detecting light from a region including a surface of the surface to be inspected to which the adhesive tape is attached and acquiring a first pattern image, a third step of inputting an electrical signal to the semiconductor device to which the adhesive tape is attached, a fourth step of acquiring a first heat generation image by detecting light according to heat radiation from the region including the surface to which the adhesive tape is attached in a state in which the electrical signal is input, and a fifth step of superimposing the first pattern image and the first heat generation image.

In such a method for inspecting a semiconductor device, the heat generation source generates heat in the semiconductor device by the input of the electrical signal. Heat generation occurs, for example, at a failure location in the semiconductor device. A heat generation location in the semiconductor device can be identified by superimposing the first heat generation image and the first pattern image of the surface to be inspected. Here, the adhesive tape having a high emissivity of 0.9 or more is attached to the surface to be inspected so that the emissivity on the surface to be inspected is made uniform with a high value regardless of a material of the surface of the semiconductor device. Further, since the adhesive tape readily transmits light, the first pattern image of the surface to be inspected can be acquired in the state in which the adhesive tape is attached. Therefore, detection accuracy of heat rays can be improved, and a position of heat generation can be identified with high accuracy.

Further, in one aspect, the semiconductor device may have an electrode which inputs the electrical signal to the surface to be inspected, and in the first step, the adhesive tape may be attached to the surface to be inspected so that at least a part of the electrode is exposed. With such a configuration, the electrical signal can be easily applied to the semiconductor device in the state in which the adhesive tape is attached.

Further, in one aspect, in the first step, the adhesive tape may be attached to the surface to be inspected to include regions having different emissivities. In this case, the emissivity of the region to which the adhesive tape is attached can be made uniform.

Further, in one aspect, the method may further include a sixth step of acquiring a second heat generation image by detecting light according to heat radiation of the semiconductor device in a state in which the electrical signal is input to the semiconductor device before the adhesive tape is attached, and in the first step, the adhesive tape may be attached to include a heat generation source of the semiconductor device based on the second heat generation image. The adhesive tape can be attached to include the heat generation source by narrowing down where the heat generation source is in advance on the basis of the second heat generation image.

Further, in one aspect, the method may further include a seventh step of acquiring a second pattern image by detecting light from the semiconductor device before the adhesive tape is attached, and in the first step, the adhesive tape may be attached to include the heat generation source of the semiconductor device based on an image in which the second pattern image and the second heat generation image are superimposed on each other. The position of the heat generation can be narrowed down easily using an image in which the second pattern image and the second heat generation image are superimposed on each other.

Further, in one aspect, a surface of the adhesive tape on a side opposite to a surface attached to the surface to be inspected may have irregularities. Reflectance on the surface of the adhesive tape is lowered by having an unevenness. Therefore, incidence of extra light reflected on the surface of the adhesive tape into the imaging device can be curbed.

Further, in one aspect, the adhesive tape may be attached to the surface to be inspected by a pressure-sensitive adhesive applied to the adhesive tape. For example, after the inspection is completed, the adhesive tape can be easily detached by using the pressure-sensitive adhesive.

Further, in one aspect, in the second step, an image captured by an infrared camera may be acquired as the first pattern image. In this case, the pattern image and the heat generation image can be acquired by the same infrared camera.

Further, in one aspect, in the second step, reflected light from the region including the surface to which the adhesive tape is attached is detected by a photodetector, and the first pattern image may be acquired. In this case, it is easy to acquire the pattern image with higher accuracy.

Effects of Invention

According to the method for inspecting a semiconductor device of one aspect, it is possible to enhance detection accuracy of heat rays.

BRIEF DESCRIPTION OF DRAWINGS

FIG. 3 is a schematic diagram showing a measurement image acquired in the method for inspecting a semiconductor device.

FIG. 5 is a schematic diagram showing a measurement image acquired in the method for inspecting a semiconductor device.

DESCRIPTION OF EMBODIMENTS

Figure 1:
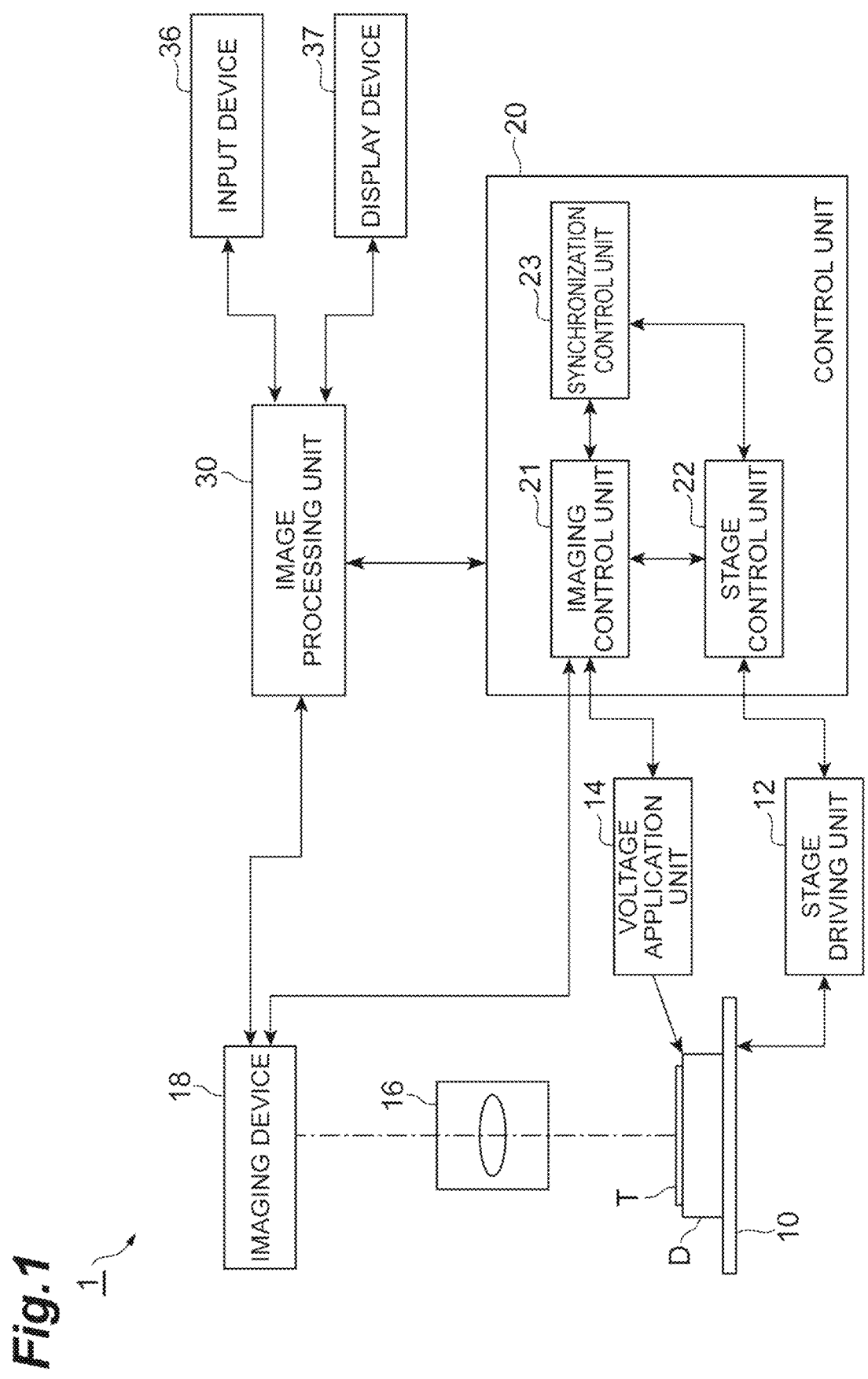
FIG. 1 is a configuration diagram of an apparatus for inspecting a semiconductor device.

Hereinafter, an embodiment will be specifically described with reference to the drawings. For convenience, the same reference numerals are given to substantially the same elements, and the description thereof may be omitted.

In a method for inspecting a semiconductor device according to the embodiment, a heat source in a semiconductor device is detected using an apparatus for inspecting a semiconductor device. For example, a failure analysis of the semiconductor device can be performed by detecting a position of the heat source. First, an example of the apparatus for inspecting a semiconductor device will be described. FIG. 1 is a block diagram showing a schematic configuration of an apparatus for inspecting a semiconductor device according to one embodiment. The apparatus 1 for inspecting a semiconductor is an apparatus which detects a position of a heat generation point in a semiconductor device D as an object to be inspected and performs a failure analysis. Examples of the semiconductor device D include an individual semiconductor device (discrete semiconductor), an optoelectronic device, a sensor/an actuator, a logic large scale integration (LSI), a memory device, a linear integrated circuit (IC), or the like, or a hybrid device thereof. The discrete semiconductor includes a diode, a power transistor, and the like. The logic LSI is configured with a metal-oxide-semiconductor (MOS) structure transistor, a bipolar structure transistor, or the like. Further, the semiconductor device D may be a package including a semiconductor device, a composite substrate, or the like.

The apparatus 1 for inspecting a semiconductor includes a sample stage 10, a stage driving unit 12 which drives the sample stage 10, a voltage application unit (an electrical signal supply unit) 14, an imaging device 18, a control unit 20, an image processing unit 30.

The semiconductor device D is placed on the sample stage 10. The sample stage 10 is configured to be driven by the stage driving unit 12 in an X-axis direction, a Y-axis direction (a horizontal direction), and a Z-axis direction (a vertical direction). Thus, focusing of imaging with respect to the semiconductor device D, aligning of imaging position, and the like are performed. The imaging device 18 is installed above the sample stage 10. In a state in which the semiconductor device D is placed on the sample stage 10, an upper surface of the semiconductor device D faces the imaging device 18 side. In this case, the upper surface of the semiconductor device D becomes a surface Da to be inspected (refer to FIG. 3).

The imaging device 18 can acquire a two-dimensional image of the semiconductor device D. In the embodiment, the imaging device 18 detects infrared rays corresponding to heat radiation from the surface Da to be inspected of the semiconductor device D and acquires a heat generation image based on the intensity of the infrared rays. The heat generation image is an image which visualizes a distribution of an amount of heat generation of the surface Da to be inspected. The heat generation image may be, for example, an image in which gradations according to the amount of heat generation is displayed. The heat radiation from the surface Da to be inspected results from the heat source in the semiconductor device D. Further, the imaging device 18 detects light from the surface Da to be inspected in the semiconductor device D and acquires a pattern image. The pattern image may be an image showing an exterior of the surface Da to be inspected in the semiconductor device D. The imaging device 18 may be, for example, an infrared camera (for example, an InSb camera) which images infrared rays (heat rays) generated from the heat source of the semiconductor device D. In this case, an exterior of the semiconductor device D imaged by the infrared camera is acquired as the pattern image. Further, the imaging device 18 may include a photodetector such as a two-dimensional camera, in addition to the infrared camera, and may acquire the pattern image using the photodetector.

A light guide optical system 16 such as an objective lens which guides an image of the surface of the semiconductor device D to the imaging device 18 is provided on an optical axis between the sample stage 10 and the imaging device 18. A driving mechanism such as an XYZ stage may be provided in the light guide optical system 16. For example, with the driving mechanism, it may be possible to perform the focusing of the imaging with respect to the semiconductor device D, the aligning of the imaging position, and the like.

The voltage application unit 14 is electrically connected to an electrode of the semiconductor device D disposed on the sample stage 10. The voltage application unit 14 can apply an electrical signal such as a current or voltage signal to the semiconductor device D. In the embodiment, the voltage application unit 14 applies an electrical signal necessary to cause a heat generation source to generate heat to an electronic circuit in the semiconductor device D. For example, the voltage application unit 14 may apply a voltage signal which periodically increases and decreases as a bias voltage. Further, lock-in detection by the imaging device may be performed by modulating the voltage signal.

The control unit 20 controls operations of the sample stage 10, the stage driving unit 12, the voltage application unit 14, the light guide optical system 16, and the imaging device 18. The control unit 20 includes an imaging control unit 21, a stage control unit 22, and a synchronization control unit 23.

The imaging control unit 21 controls acquisition of an analysis image of the semiconductor device D by controlling a voltage signal application operation by the voltage application unit 14 and an image acquisition operation by the imaging device 18. Further, the stage control unit 22 controls operations of the sample stage 10 and the stage driving unit 12 (movement operations of the semiconductor device D on the sample stage 10). Also, the synchronization control unit 23 performs control for obtaining necessary synchronization between the imaging control unit 21 and the stage control unit 22 and the image processing unit 30 provided for the imaging device 18.

The image processing unit 30 is image processing means which performs image processing necessary for a failure analysis of the semiconductor device D on the image acquired by the imaging device 18. In the embodiment, the image processing unit 30 can generate a superimposed image in which a heat generation image is superimposed on a pattern image. That is, the image processing unit 30 can receive data of the pattern image and the heat generation image from the imaging device 18 and can superimpose the heat generation image on the received pattern image. The image processing unit 30 is configured using, for example, a computer including a processor (CPU: Central Processing Unit) and a storage medium such as a RAM (Random Access Memory), ROM (Read Only Memory), and HDD (Hard Disk Drive), and the like. The image processing unit 30 performs processing on data stored in the storage medium by the processor. Further, the image processing unit 30 may be configured with a microcomputer, a field-programmable gate array (FPGA), a cloud server, a smart device, or the like. Also, an input device 36 and a display device 37 are connected to the image processing unit 30. The input device 36 includes, for example, a keyboard, a mouse, and the like and is used for inputting information or an operation instruction necessary to perform an image acquisition operation and a failure analysis operation in the apparatus 1 for inspecting a semiconductor device. Furthermore, the display device 37 is configured with, for example, a CRT display, a liquid crystal display, or the like and is used for displaying a variety of information such as an image acquired by the image processing unit 30. The image of the semiconductor device D acquired by the imaging device 18 may be input to the image processing unit 30 and may be stored and accumulated as necessary.

The image processing unit 30 may be configured with a single control device (for example, a single computer) together with the control unit 20. Further, similarly, the input device 36 and the display device 37 connected to the image processing unit 30 may serve as an input device and a display device connected to the control unit 20 as well as the image processing unit 30.

Figure 2:
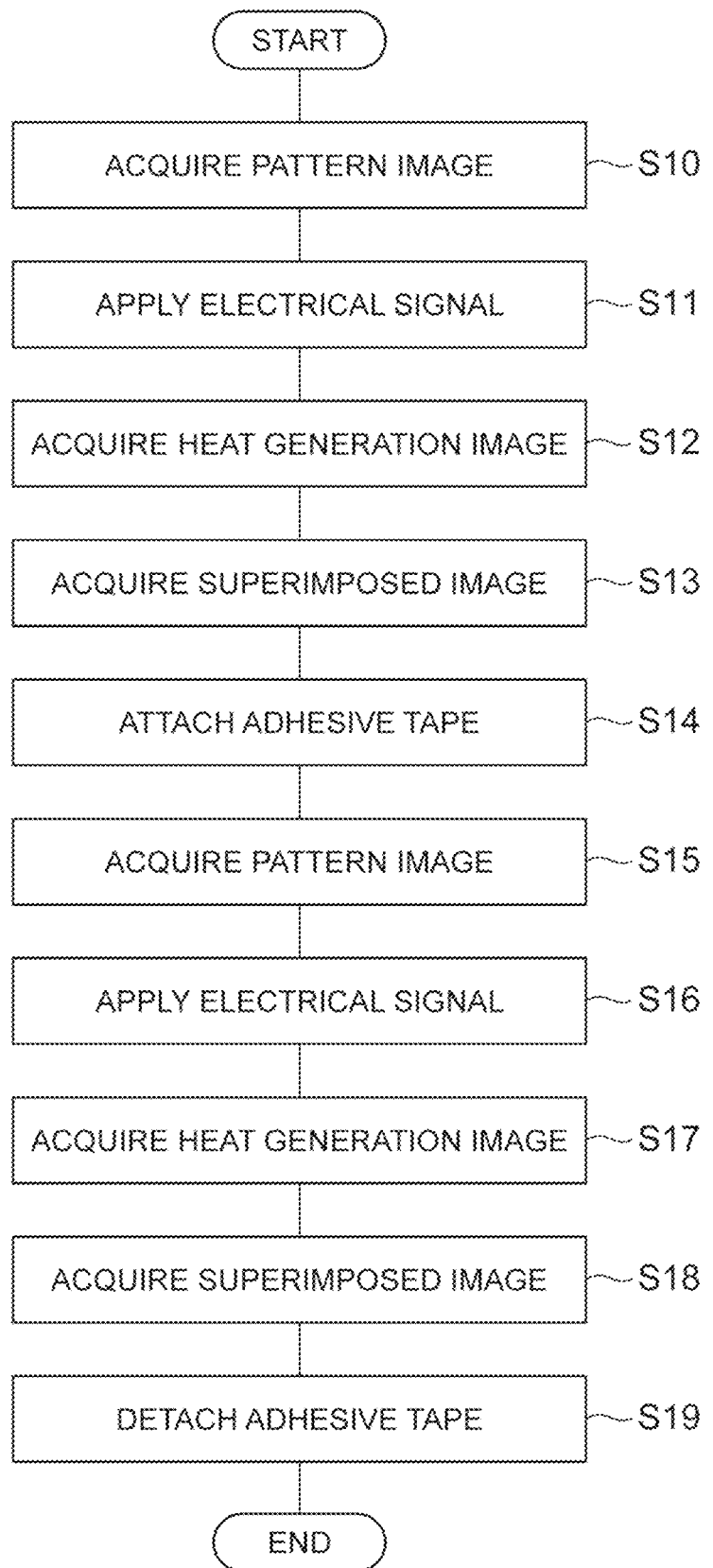
FIG. 2 is a flowchart showing a method for inspecting a semiconductor device according to an embodiment.
Figure 4:
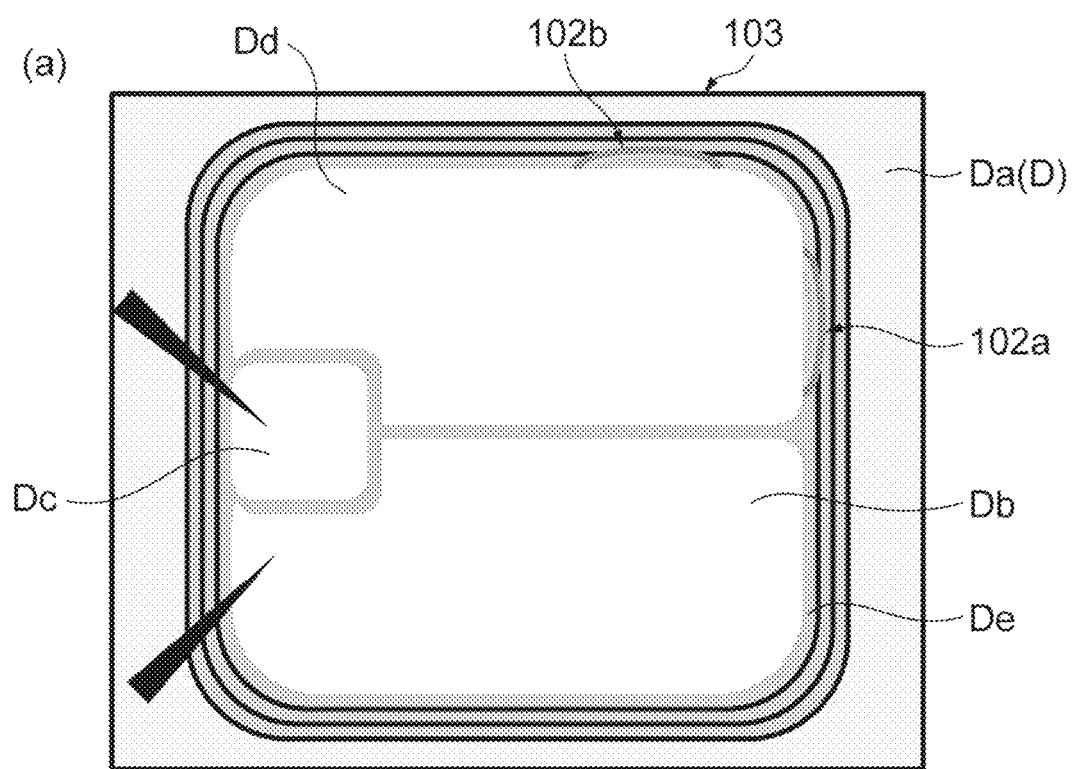
FIG. 4 is a schematic diagram showing a measurement image acquired in the method for inspecting a semiconductor device.
Figure 6:
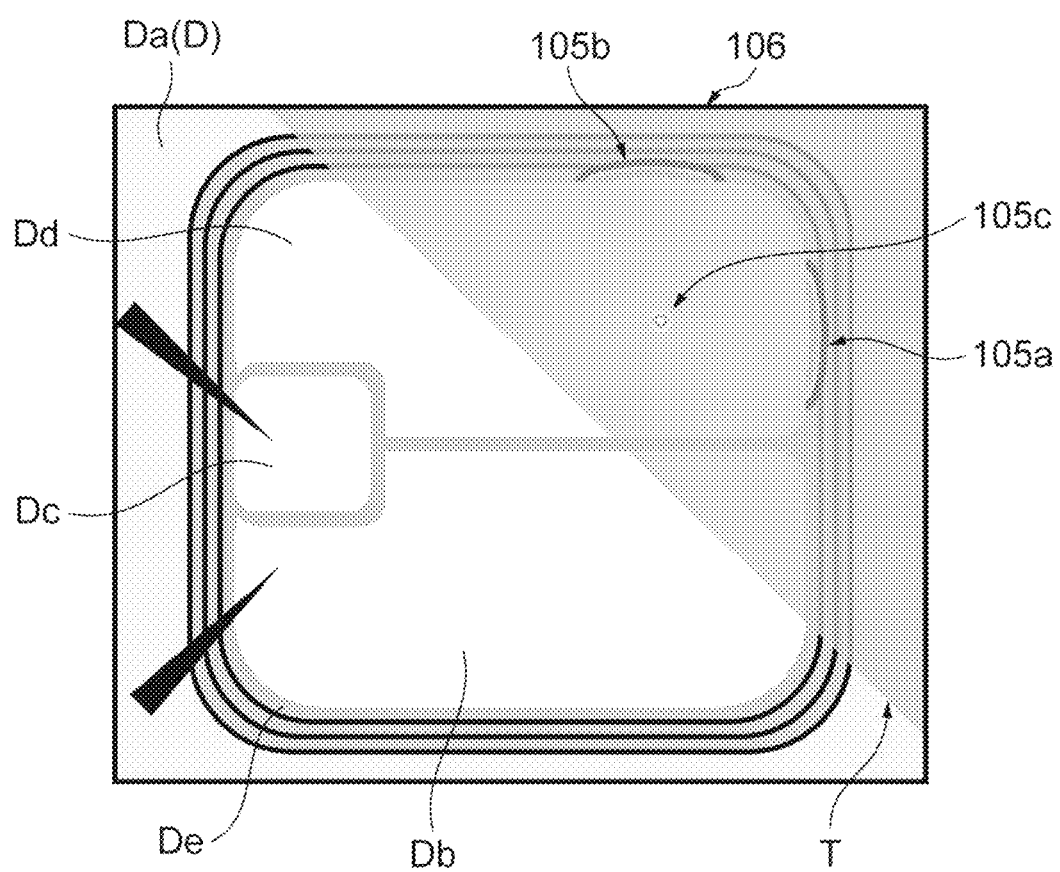
FIG. 6 is a schematic diagram showing a measurement image acquired in the method for inspecting a semiconductor device.

Next, the method for inspecting a semiconductor device according to the embodiment will be described. FIG. 2 is a flowchart showing the method for inspecting a semiconductor device using the apparatus 1 for inspecting a semiconductor device. FIG. 3 is a schematic diagram showing a measurement image acquired in the method for inspecting a semiconductor device. FIG. 3(a) shows a pattern image 101 of the semiconductor device D. FIG. 3(b) shows a heat generation image 102 of the semiconductor device D. FIG. 4 shows a superimposed image 103 in which the image of FIG. 3(b) is superimposed on the image of FIG. 3(a). FIG. 5 is a schematic diagram showing a measurement image acquired in the method for inspecting a semiconductor device. FIG. 5(a) shows a pattern image 104 of the semiconductor device D. FIG. 5(b) shows a heat generation image 105 of the semiconductor device D. FIG. 6 shows a superimposed image 106 in which the image of FIG. 5(b) is superimposed on the image of FIG. 5(a).

In the method for inspecting a semiconductor device according to the embodiment, a pattern image and a heat generation image of the semiconductor device D can be acquired in a state in which an adhesive tape T is attached to the surface Da to be inspected of the semiconductor device D. The adhesive tape T is not attached to the semiconductor device D in FIGS. 3 and 4, and the adhesive tape T is attached to the semiconductor device D in FIGS. 5 and 6. An emissivity of the adhesive tape T used in the method is 0.9 or more. The emissivity only needs to be 0.9 or more in a part of a wavelength range of 2000 nm to 6500 nm at room temperature (5° C. to 35° C. [41° F. to 95° F.]), for example. Moreover, a light transmittance of the adhesive tape T is 60% or more at a wavelength of 300 nm to 2000 nm. The light transmittance may be an average transmittance at a wavelength of 300 nm to 2000 mm. The adhesive tape T is formed of a film-shaped base material made of a synthetic resin and a pressure-sensitive adhesive applied to one surface of the base material. Minute irregularities may be formed on the other surface of the base material. Due to the irregularities formed on the other surface of the base material, the surface has a physically rough form (a rough surface), and a matted effect is imparted to the surface. As an example, the adhesive tape T is a so-called mending tape which uses an acetate film as a base material.

In the method for inspecting a semiconductor device, the semiconductor device D as an object to be inspected is placed on the sample stage 10. Electrodes Db, Dc, and Dd which are electrically connected to an electronic circuit in the semiconductor device D are provided on the surface Da to be inspected of the semiconductor device D (refer to FIG. 3(a)). The electrodes Db, Dc, and Dd are formed of a metal material such as aluminum, for example. The electrodes Db, Dc, and Dd are formed in a film shape to cover a part of the surface to be inspected. A region De on the surface Da to be inspected which is not covered with the electrodes Db, Dc, and Dd is formed of a resin material such as highly insulating polyimide, for example.

As shown in FIG. 2, in the method, before the adhesive tape T is attached, light from the semiconductor device D placed on the sample stage 10 is detected, and a pattern image (a second pattern image) 101 of the semiconductor device D is acquired (Step S10 (a seventh step)). In Step S10, for example, the voltage application unit 14 is electrically connected to the electrodes Db and Dc of the semiconductor device D positioned on the sample stage 10. In this state, a relative position between the semiconductor device D on the sample stage 10 and the imaging device 18 is adjusted by driving the stage driving unit 12. The pattern image 101 of the semiconductor device D is acquired by the imaging device 18 in a state in which the surface Da to be inspected of the semiconductor device D is adjusted such that it can be imaged. In an example of the pattern image 101 shown in FIG. 3(a), a voltage application needle 14a provided in the voltage application unit 14 is in the image.

Subsequently, before the adhesive tape T is attached, light corresponding to the heat radiation of the semiconductor device D is detected in the state in which an electrical signal is applied to the semiconductor device D, and a heat generation image (a second heat generation image) 102 is acquired (Step S11, Step S12 (a sixth step)). In Step S11, a current or voltage signal is applied as the electrical signal from the voltage application unit 14 to the semiconductor device D. In the electronic circuit in the semiconductor device D, heat rays are generated with a failure location as the heat generation source by applying the electrical signal. The heat generation image 102 is acquired by imaging the surface Da to be inspected using the imaging device 18 such as an infrared camera (refer to FIG. 3(b)). In the example of FIG. 3(b), some of the heat diffused from a heat generation source is detected and displayed as heat generation regions 102a and 102b.

Subsequently, a superimposed image 103 in which the pattern image 101 and the heat generation image 102 are superimposed on each other is acquired (Step S13). That is, the pattern image 101 acquired in Step S10 and the heat generation image 102 acquired in Step S12 are superimposed by the image processing unit 30. In the embodiment, the heat generation image 102 is superimposed on the pattern image 101. In the superimposed image 103 shown in FIG. 4, the heat rays from the region De formed of a resin material are detected outside the region covered with the electrode Dd. From a position of the detected heat rays, it can be assumed that the heat generation source is below the electrode Dd. In particular, in the example of FIG. 4, it can be assumed that the heat generation source is at a position in the electrode Dd on the heat generation regions 102a and 102b side. As described above, a position of the heat generation source in the semiconductor device D can be roughly identified by referring to the superimposed image 103.

Subsequently, the adhesive tape T is attached on the surface Da to be inspected of the semiconductor device D (Step S14 (a first step)). In the embodiment, the adhesive tape T is attached to include the heat generation source of the semiconductor device D. In Step S14, the adhesive tape T can be attached to include the heat generation source of the semiconductor device D on the basis of the superimposed image 103 acquired in Step S13. As shown to FIG. 5(a), the adhesive tape T is attached at a position near the heat generation regions 102a and 102b on the electrode Dd. Moreover, the adhesive tape T is also attached at positions of the heat generating regions 102a and 102b.

In Step S14, the adhesive tape T can be adhered to the surface Da to be inspected so that at least a part of the electrodes of the semiconductor device D is exposed. As shown in FIG. 5(a), for example, portions of the electrode Db, Dc, and Dd which are planned to be connected to a pair of needles of the voltage application unit 14 can be exposed. Further, in Step S14, the adhesive tape T can be attached to the surface Da to be inspected to include regions having different emissivities. In the embodiment, the adhesive tape T is adhered to straddle the electrode Dd having a low emissivity and the region De of the resin material having a higher emissivity than that of the electrode Dd. Furthermore, in the shown example, the adhesive tape T is attached diagonally to be inclined with respect to a peripheral edge of the semiconductor device D in a plan view. When the adhesive tape T is attached, air is prevented from entering between the adhesive tape T and the semiconductor device D to curb a decrease in heat conduction due to an air layer. The semiconductor device D to which the adhesive tape T is attached is placed again on the sample stage 10.

Subsequently, light from a region of the surface Da to be inspected which includes a surface to which the adhesive tape T is attached is detected, and a pattern image (a first pattern image) is acquired (Step S15 (a second step)). In Step S15, the voltage application unit 14 is electrically connected again to the electrodes Db and Dc of the semiconductor device D positioned on the sample stage 10. In this state, the relative position between the semiconductor device D on the sample stage 10 and the imaging device 18 is adjusted by driving the stage driving unit 12. The pattern image 104 of the semiconductor device D is acquired by the imaging device 18 in a state in which the surface Da to be inspected of the semiconductor device D is adjusted to be imaged. In the embodiment, since the adhesive tape T transmits light in a wavelength band which can be detected by the imaging device 18, a pattern can be confirmed even in the pattern image 104 acquired in the state in which the adhesive tape T is attached.

Subsequently, an electrical signal is input to the semiconductor device D to which the adhesive tape T is attached (Step S16 (a third step)). Then, in a state in which the electrical signal is input, light corresponding to the heat radiation from a region including the surface to which the adhesive tape T is attached is detected, and the heat generation image (the first heat generation image) 105 is acquired (Step S17 (a fourth step)). In Step S16, a current or voltage signal is applied as the electrical signal from the voltage application unit 14 to the semiconductor device D. In the electronic circuit in the semiconductor device D, the heat rays are generated with a failure location as the heat generation source by applying the electrical signal. The heat generation image 105 is acquired by imaging the surface Da to be inspected to which the adhesive tape T is adhered using the imaging device 18. In the heat generation image 105, heat generation regions 105a and 105b corresponding to the heat generation regions 102a and 102b and a heat generation region 105c which is not displayed in the heat generation image 102 are displayed. In the embodiment, the acquisition of the image by the imaging device 18 ends with the acquisition of the heat generation image 105 in Step S17.

Subsequently, the pattern image 104 acquired in Step S15 and the heat generation image 105 acquired in Step S17 are superimposed by the image processing unit 30, and the superimposed image 106 is acquired (Step S18 (a fifth step)). As shown in FIG. 6, in the embodiment, the heat generation image 105 is superimposed on the pattern image 104. Further, in the same drawing, the heat generation region 105c is superimposed on a portion covered with the electrode Dd. The heat generation region 105c is superimposed with the region to which the adhesive tape T is attached. For example, it can be determined on the basis of the superimposed image 106 that a position corresponding to the heat generation region 105c is the heat generation source. The adhesive tape T can be detached from the semiconductor device D at any timing after the acquisition of the image by the imaging device 18 ends (Step S19).

In the above-described method for inspecting a semiconductor device, the heat generation source generates heat in the semiconductor device D by the input of the electrical signal. Such heat generation occurs, for example, at the failure location of the electronic circuit in the semiconductor device D. Therefore, the heat generation source in the semiconductor device D can be identified by superimposing the pattern image 104 and the heat generation image 105 of the surface Da to be inspected. However, the emissivity of the electrodes formed of a metal is low. When the position of the heat generation source overlaps the positions of the electrodes, the intensity of emitted infrared light decreases. Thus, the heat generation source may not appear in the heat generation image. In the embodiment, the adhesive tape T having a high emissivity of 0.9 or more is attached to the surface Da to be inspected. In this way, the emissivity in the region in which the adhesive tape T is attached is made uniform with a high value by attaching the adhesive tape T on the surface Da to be inspected. Therefore, even when the position of the heat generation source overlaps the positions of the electrodes, the emitted infrared light can be detected. Moreover, since the adhesive tape T is easy to transmit light, the pattern image 104 of the surface to be inspected can be obtained with the adhesive tape T attached to the surface to be inspected. Therefore, it is possible to improve detection accuracy of the heat rays and to specify the position of the heat generation with high accuracy.

Further, in Step S14, the adhesive tape T can be attached to the surface Da to be inspected so that at least a part of the electrode is exposed. With such a configuration, the voltage application unit 14 can be connected to the semiconductor device D in the state in which the adhesive tape T is attached. The electrical signal can be easily applied.

Further, in Step S14, the adhesive tape T may be attached to the surface Da to be inspected to include regions having different emissivities. For example, the regions having different emissivities are a portion covered with an electrode and a portion formed of a resin material. In this case, the emissivities of the regions to which the adhesive tape T is attached can be made uniform.

Further, in Step S14, the adhesive tape T can be attached to include the heat generation source of the semiconductor device D on the basis of the heat generation image 102 by acquiring the heat generation image 102 before the adhesive tape T is attached. As described above, the adhesive tape T can be attached to reliably include the heat generation source by narrowing down where the heat generation source is on the basis of the heat generation image 102 in advance. In this case, in Step S14, the adhesive tape T may be attached on the basis of the superimposed image 103 by acquiring the pattern image 101 before the adhesive tape T is attached. It is possible to easily narrow down the heat generation source using the superimposed image 103.

Further, a surface of the adhesive tape T on the side opposite to a surface attached to the surface Da to be inspected may have irregularities. Due to the irregularities, a matted effect is imparted to the surface of the adhesive tape T. Due to the matted effect, reflectance of the surface of the adhesive tape T is lowered. Thus, incidence of extra light reflected on the surface of the adhesive tape T into the imaging device 18 can be curbed.

Further, the adhesive tape T is attached to the surface Da to be inspected by a pressure-sensitive adhesive applied to the adhesive tape T. For example, after the inspection is completed, the adhesive tape T can be easily detached by using the pressure-sensitive adhesive.

Further, the pattern image of the semiconductor device D can be imaged by an infrared camera. In this case, the pattern image and the heat generation image can be acquired by the same infrared camera. The configuration of the imaging device 18 can be simplified.

Further, the pattern image may be acquired by detecting reflected light from a region including the surface Da to be inspected with a photodetector. In this case, it is easier to acquire the pattern image with higher accuracy than in the infrared camera.

Although the embodiment has been described in detail with reference to the drawings, the specific configuration is not limited to this embodiment.

Figure 7:
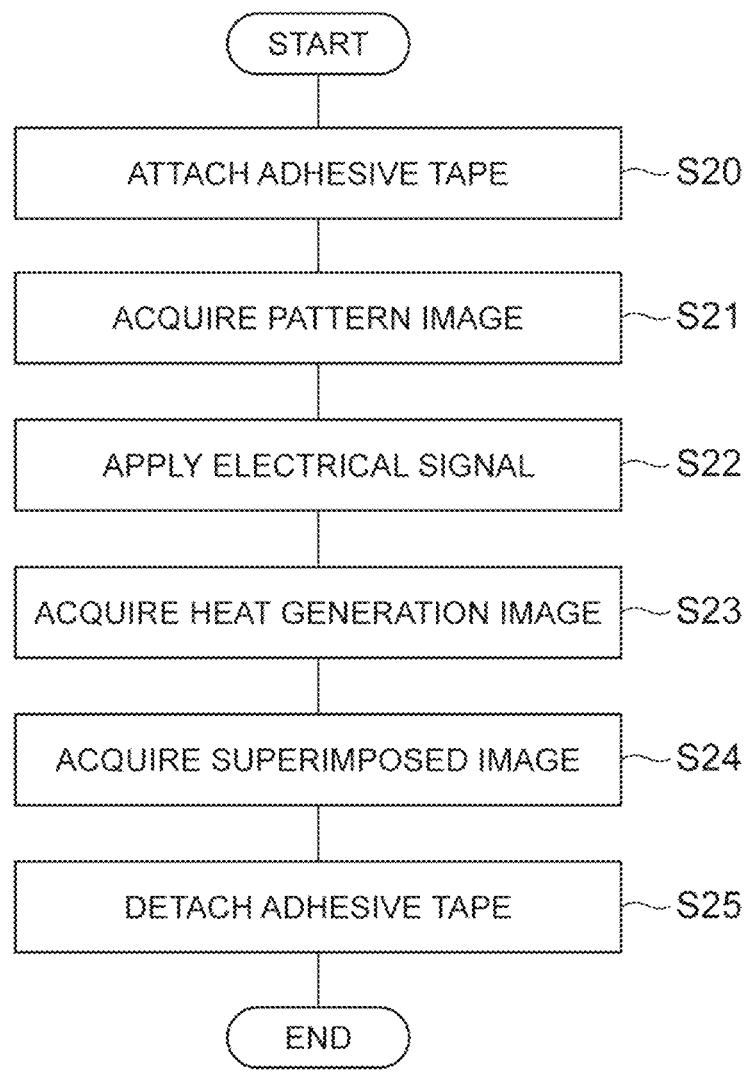
FIG. 7 is a flowchart showing a method for inspecting a semiconductor device according to a modified example.

In the above-described embodiment, the position of the heat generation source is roughly estimated by acquiring the superimposed image in advance, but the present invention is not limited thereto. FIG. 7 is a flowchart showing a method for inspecting a semiconductor device according to a modified example. In the method for inspecting a semiconductor device, first, the adhesive tape T is attached to the surface to be inspected of the semiconductor device (Step S20). In the embodiment, in the surface to be inspected of the semiconductor device D, only the portions of the electrodes which are planned to be connected to the pair of needles of the voltage application unit 14 is exposed, and the adhesive tape T is attached thereto. Therefore, the adhesive tape T is attached to include the heat generation source almost certainly without acquiring the superimposed image in advance.

Subsequently, light from the surface to be inspected is detected, and a pattern image is acquired (Step S21). In Step S21, the voltage application unit 14 is electrically connected to the electrodes of the semiconductor device D positioned on the sample stage 10. In this state, the pattern image 104 of the semiconductor device D is acquired by the imaging device 18.

Subsequently, an electrical signal is input to the semiconductor device D to which the adhesive tape T is adhered (Step S22), and the heat generation image 105 is acquired in a state in which the electrical signal is input (Step S23). In the embodiment, the acquisition of the image by the imaging device 18 is completed with the acquisition of the heat generation image 105 in Step S23.

Subsequently, the pattern image 104 acquired in Step S21 and the heat generation image 105 acquired in Step S23 are superimposed by the image processing unit 30, and the superimposed image 106 is acquired (Step S24). A heat generation location can be identified by analyzing the superimposed image 106. After the inspection, the adhesive tape T is detached from the semiconductor device D (Step S25).

Further, in the embodiment, the example in which a two-dimensional image is acquired by the imaging device 18 such as an infrared camera has been described, but the present invention is not limited thereto. For example, the imaging device may be configured by a light source such as a laser and a super luminescent diode, an optical scanner such as a galvanometer mirror which scans the surface to be inspected two-dimensionally with light from the light source, and a photodetector such as a photodiode or an avalanche photodiode which detects reflected light from the surface to be inspected. In this case, the heat generation image may be generated on the basis of a change in reflectance on the surface to be inspected.

REFERENCE SIGNS LIST

1 Apparatus for inspecting semiconductor device
101 Pattern image (second pattern image)
102 Heat generation image (second heat generation image)
103 Superimposed image
104 Pattern image (first pattern image)
105 Heat generation image (first heat generation image)
106 Superimposed image
D Semiconductor device
Da Surface to be inspected
Db, Dc, Dd Electrode
T Adhesive tape

The invention claimed is:

1. A method for inspecting a semiconductor device which performs an inspection of a semiconductor device as an object to be inspected, the method comprising:
attaching an adhesive tape having a emissivity of 0.9 or more and a light transmittance of 60% or more at a wavelength of 300 nm to 2000 nm to a surface to be inspected of the semiconductor device;

acquiring a first pattern image based on a light detected from a region including a surface of the surface to be inspected to which the adhesive tape is attached;

inputting an electrical signal to the semiconductor device to which the adhesive tape is attached;

acquiring a first heat generation image by detecting light according to heat radiation from the region in a state in which the electrical signal is input;

superimposing the first pattern image and the first heat generation image; and acquiring a second heat generation image by detecting light according to heat radiation of the semiconductor device in a state in which the electrical signal is input to the semiconductor device before the adhesive tape is attached, wherein, in the attaching the adhesive tape, the adhesive tape is attached to include a heat generation source of the semiconductor device based on the second heat generation image.

2. The method according to claim 1, wherein:

the semiconductor device has an electrode which inputs the electrical signal to the surface to be inspected, and wherein, in the attaching the adhesive tape, the adhesive tape is attached to the surface to be inspected so that at least a part of the electrode is exposed.

3. The method according to claim 1, wherein, in the attaching the adhesive tape, the adhesive tape is attached to the surface to be inspected to include regions having different emissivities.

4. The method according to claim 1, further comprising acquiring a second pattern image by detecting light from the semiconductor device before the adhesive tape is attached, wherein, in the attaching the adhesive tape, the adhesive tape is attached to include the heat generation source of the semiconductor device based on an image in which the second pattern image and the second heat generation image are superimposed on each other.

5. The method according to claim 1, wherein a surface of the adhesive tape on a side opposite to a surface attached to the surface to be inspected has irregularities.

6. The method according to claim 1, wherein the adhesive tape is attached to the surface to be inspected by a pressure-sensitive adhesive applied to the adhesive tape.

7. The method according to claim 1, wherein, in the acquiring the first pattern image, an image captured by an infrared camera is acquired as the first pattern image.

8. The method according to claim 1, wherein, in the acquiring the first pattern image, reflected light from the region is detected by a photodetector, and the first pattern image is acquired.

* * * * *